(12) United States Patent
Schultz et al.

(10) Patent No.: US 7,585,615 B2
(45) Date of Patent: Sep. 8, 2009

(54) COMPOSITE PHOTORESIST FOR MODIFYING DIE-SIDE BUMPS

(75) Inventors: Kurt Schultz, Banks, OR (US); Kevin J. Lee, Beaverton, OR (US); Michael D. Goodner, Hillsboro, OR (US); Shane Nolen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 256 days.

(21) Appl. No.: 11/495,368

(22) Filed: Jul. 27, 2006

(65) Prior Publication Data

US 2008/0026318 A1 Jan. 31, 2008

(51) Int. Cl.
*G03F 7/00* (2006.01)
*G03F 7/004* (2006.01)

(52) U.S. Cl. .................. 430/311; 430/270.1; 430/138; 430/322; 430/325; 430/330

(58) Field of Classification Search .................. 430/311, 430/270.1, 138, 322, 325, 330
See application file for complete search history.

(56) References Cited

U.S. PATENT DOCUMENTS

| | | | |
|---|---|---|---|
| 6,622,907 B2 * | 9/2003 | Fanti et al. .................. 228/215 |
| 6,913,865 B2 * | 7/2005 | Fedynyshyn ................ 430/191 |
| 2003/0124833 A1 * | 7/2003 | Tong et al. .................. 438/613 |
| 2004/0209453 A1 * | 10/2004 | Akamatsu et al. ........... 438/613 |
| 2006/0134902 A1 | 6/2006 | Dubin et al. |
| 2006/0276022 A1 | 12/2006 | Li et al. |

OTHER PUBLICATIONS

Lee, Kevin J. "Tpered Die Sidebumps", filed: Jun. 30, 2006, U.S. Appl. No. 11/479,091.

* cited by examiner

*Primary Examiner*—Amanda C. Walke
(74) *Attorney, Agent, or Firm*—Rahul D. Engineer (57) ABSTRACT

A composite photoresist comprises a photoresist material and a filler material dispersed within the photoresist material, wherein the filler material includes a plurality of nanoparticles. The photoresist material may comprise an acrylic-based photoresist, a novolak-based photoresist, a polyhydroxystyrene-based photoresist, a SLAM, or a BARC. The filler material may comprise base-soluble styrene-butadiene rubber nanospheres, nitrile-butadiene rubber nanospheres, polystyrene-based nanoparticles, acrylic-based nanoparticles, or inorganic nanoparticles. The nanoparticles may have an average diameter that is between around 10 nm and around 1000 nm and may have a loading in the photoresist material that is between around 5% and 50%. The composite photoresist may be used to form die-side metal bumps for use in a C4 connection that have a roughened sidewall surface but a smooth top surface.

10 Claims, 10 Drawing Sheets

COMPOSITE PHOTORESIST FOR MODIFYING DIE-SIDE BUMPS

BACKGROUND

After a microelectronic chip or die has been manufactured, it is typically packaged before it is sold. The package provides electrical connection to the chip's internal circuitry, protection from the external environment, and heat dissipation. In one package system, a chip is flip-chip connected to a package substrate. In a flip-chip package, also known as a controlled-collapse chip connection (C4), electrical leads on the die are distributed on its active surface and the active surface is electrically connected to corresponding leads on a package substrate.

Figure 1A:
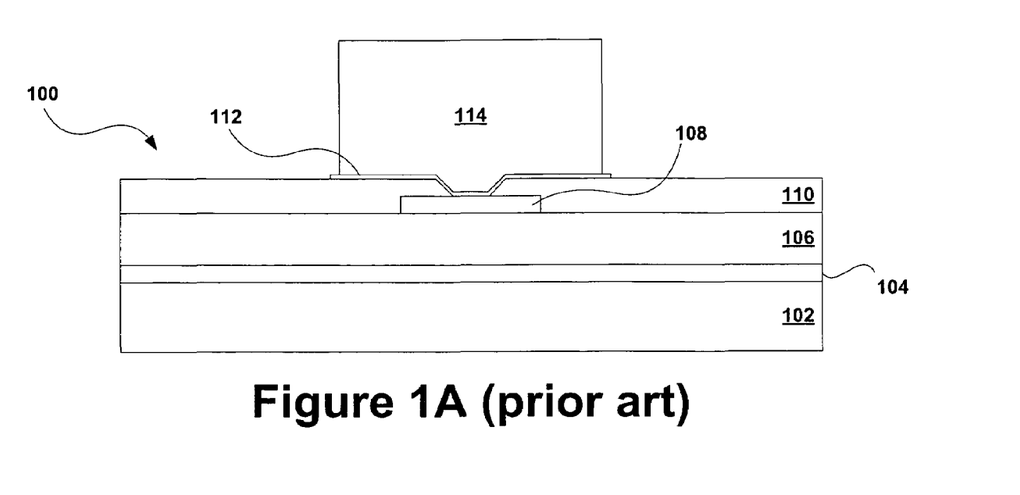
FIGS. 1A to 1C illustrate a prior art method for flip-chip (C4) packaging a integrated circuit die.
Figure 1B:
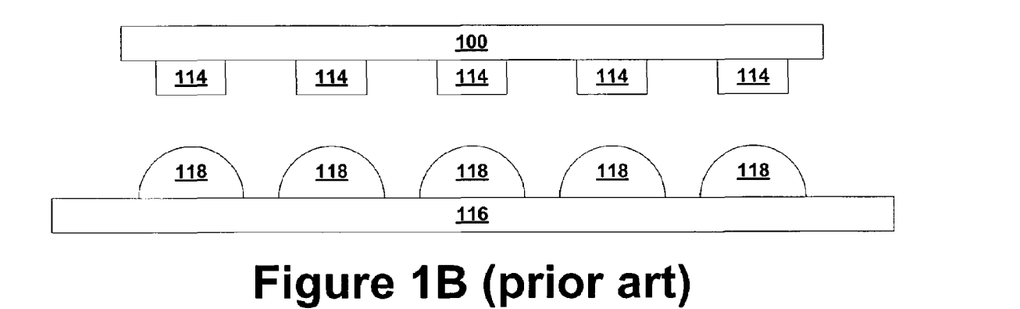
Figure 1C:
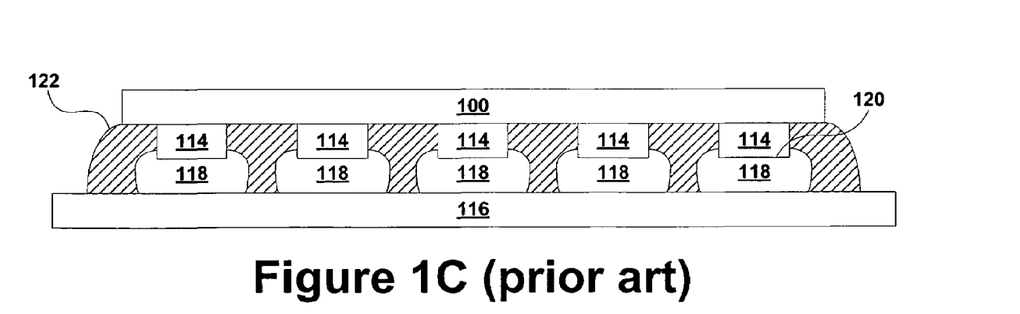

FIGS. 1A through 1C illustrate a prior art method for flip-chip packaging a microelectronic chip or die. In FIG. 1A, a portion of a integrated circuit (IC) die 100 including a conductive metal bump 114 is illustrated. For clarity, the conductive metal bump will herein be referred to as a die-side bump. The IC die 100 includes a substrate 102, a device layer 104, an interconnect region 106, and an IC pad 108. The device layer 104 typically includes a variety of electrical circuit elements (not shown), such as transistors, conductors, and resistors, formed in and on a semiconductor substrate material. The interconnect region 106 includes layers of interconnected metal vias and metal lines, which are separated by dielectric materials, that provide electrical connection between the devices of the device layer 104 and electrical routing to conductive IC pads, including the IC pad 108. Typically, a dielectric layer 110, a barrier metal 112, and a die-side bump 114 are formed over the IC pad 108, with the die-side bump 114 providing a structure for electrical connection from the die 100 to an external package substrate.

As shown in FIGS. 1B and 1C, in a common C4 flip-chip package system, the IC die 100 is flip-chip bonded to a package substrate 116 such that its active surface, including its die-side bumps 114, faces a surface of the package substrate 116 that includes solder bumps 118. An electrical connection is formed between the die-side bumps 114 and the solder bumps 118 at a joint 120. As shown, the joint 120 typically includes a portion of the die-side bumps 114 being depressed into the solder bumps 118. Heat may be applied to reflow at least the solder material to create a fixed connection between the solder bumps 118 and the die-side bumps 114.

Also illustrated in FIG. 1C is an underfill material 122 that is provided between the IC die 100 and the package substrate 116. In some processes, the underfill material is a capillary underfill material and the die-side bumps 114 are copper. In such systems, the underfill material 122 may not adhere well to the die-side bumps 114 of the IC die 100. The lack of adhesion between the die-side bumps 114 and the underfill material 122 may cause numerous difficulties. For example, it may cause cracking of the dielectric material in the interconnect region 106 of the IC die 100, or in the dielectric layer 110, leading to device failure. Further, lack of adhesion may cause undesirable gaps and cracks in the underfill material 122 itself.

Attempts have been made to address the adhesion issue, however, currently there is no good solution to this problem. Modifications to the underfill material formulation have been researched but only minor improvements in underfill-to-die-side bump adhesion have been observed thus far. Roughening the sidewalls of the die-side bumps 114 using a wet chemical microetchant is another method of improving adhesion. Unfortunately, the wet chemical microetchant also roughens the top surface of the die-side bumps 114, leading to packaging issues such as entrapped flux that causes voids in the die-side bump-to-solder bump connection after the semiconductor chip is attached. The microetchant also tends to damage other films on the wafer, such as the buffer coating material. Accordingly, alternate methods of roughening the sidewalls of the die-side bumps 114 are needed.

DETAILED DESCRIPTION

Described herein are systems and methods of modifying die-side bumps to improve adhesion. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention improve adhesion between a die-side bump, generally formed from copper metal, and an epoxy underfill material. In accordance with implementations of the invention, die-side bumps are formed with physically roughened sidewalls relative to conventional die-side bumps. The roughened sidewalls improve adhesion because the imperfections in the sidewalls (e.g., peaks and valleys on the sidewall surface) mechanically secure the epoxy underfill material to the sidewall, substantially locking the epoxy material in place. Unlike the prior art, however, the top surfaces of the die-side bumps remain substantially smooth, eliminating known issues that arise when the top surfaces of the die-side bump are roughened, and layers of the integrated circuit die are not damaged by the use of microetchants.

Figure 1D:
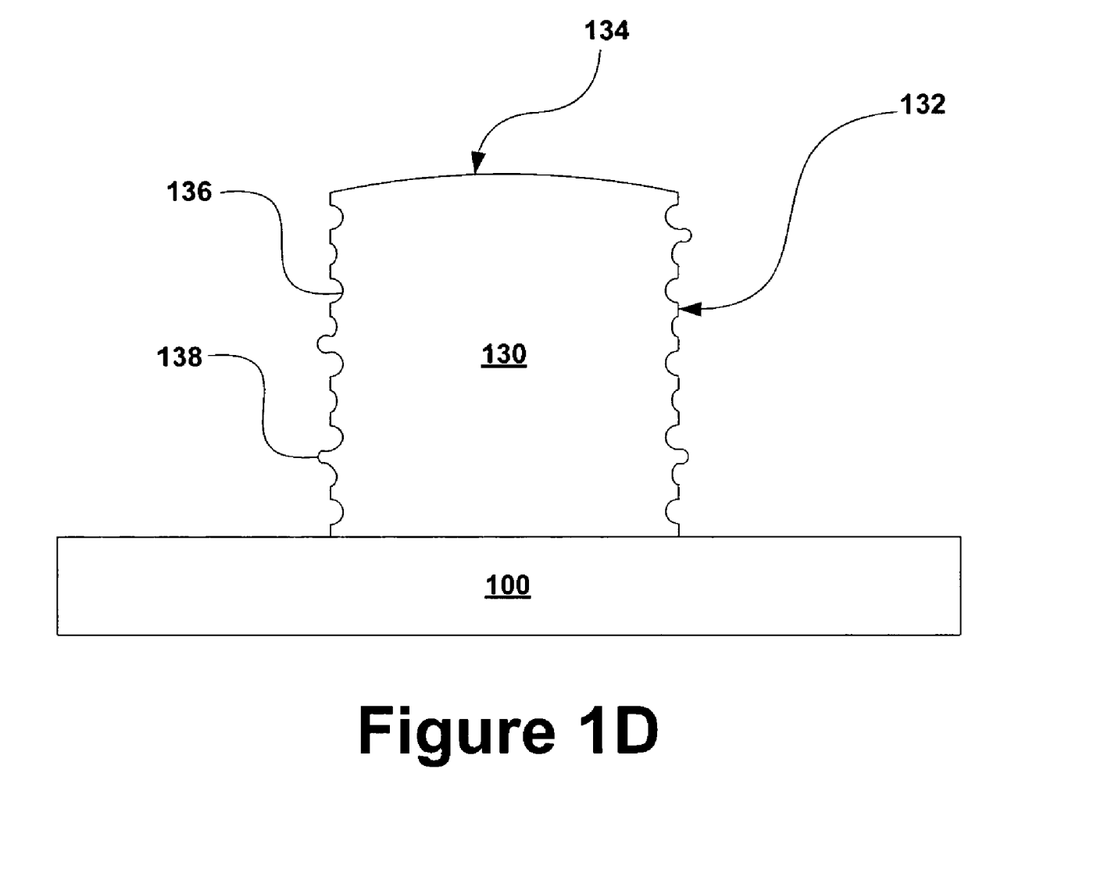
FIG. 1D illustrates a die-side bump formed in accordance with an implementation of the invention.

FIG. 1D illustrates a novel die-side bump 130 having roughened sidewalls 132 in accordance with implementations of the invention. The die-side bump 130 is mounted upon a substrate, such as an integrated circuit (IC) die 100. A top surface 134 of the die-side bump 130 remains substantially smooth. The roughened sidewalls 132 of the die-side bump 130 include depressed areas 136, such as craters, pits, and valleys, as well as elevated areas 138, such as protrusions and peaks.

Figure 1E:
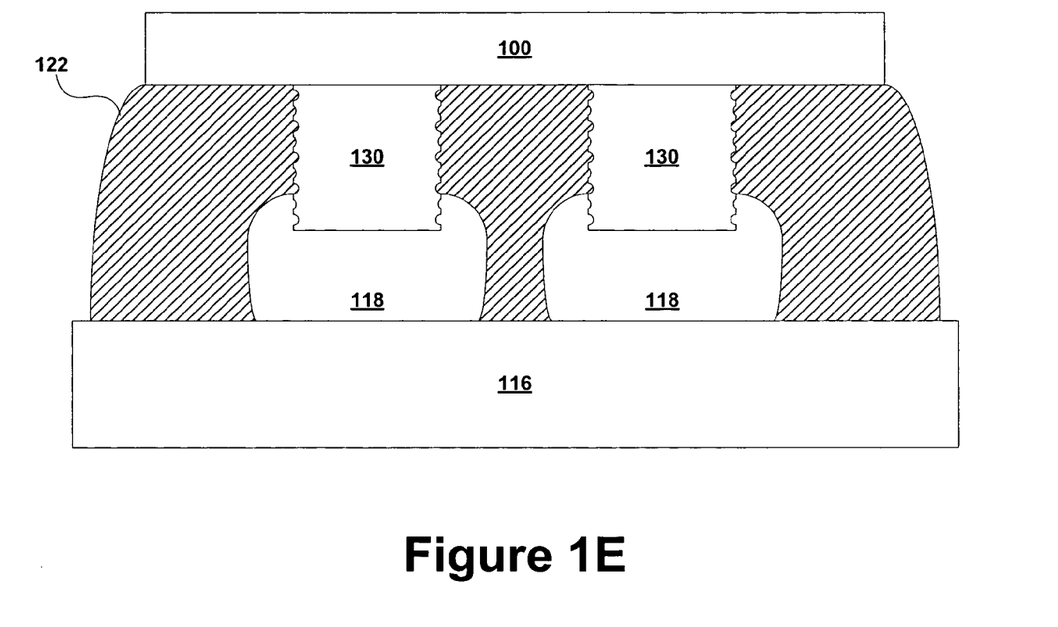
FIG. 1E illustrates two die-side bumps securing an epoxy underfill material in place in accordance with an implementation of the invention.

Turning to FIG. 1E, a C4 process is shown where two die-side bumps 130 on an IC die 100 are flip-chip connected to two solder bumps 118 on a package substrate 116. An epoxy underfill material 122 is injected between the IC die 100 and the package substrate 116 to fill-in voids around the die-side bumps 130 and the solder bumps 118. In accordance with the invention, the roughened sidewalls 132 of the die-side bumps 130, namely the depressed areas 136 and the elevated areas 138, tend to mechanically secure or lock the epoxy underfill material 122 in place, thereby significantly decreasing the likelihood of delamination.

In implementations of the invention, a composite sacrificial material may be used to fabricate the die-side bump 130 shown in FIG. 1D. In some implementations, the composite sacrificial material includes a photoresist material. Conventional photoresist materials that are well known in the art may be used in implementations of the invention. For instance, specific photoresist materials that may be used include, but are not limited to, acrylic-based photoresists (e.g., JSR THB-150N, manufactured by JSR Micro of Sunnyvale, Calif.), novolak-based photoresists, or polyhydroxystyrene-based photoresists. As is known in the art, the photoresist material may be a positive photoresist or a negative photoresist. In other implementations, the composite sacrificial material may include a sacrificial light absorbing material (SLAM) or a bottom anti-reflecting coating material (BARC).

In accordance with implementations of the invention, the composite sacrificial material may also include a filler material. The filler material may consist of nanoparticles that can disperse and become substantially suspended in the sacrificial material, by either a chemical or a physical means. The size of the filler material (e.g., nanoparticle diameter) and its loading in the sacrificial material may be optimized to provide the desired surface roughness in the die-side bump to be formed. In various implementations of the invention, the particle size of the filler may range from around 10 nanometers (nm) to around 1000 nm. For purposes of this disclosure, particles having an average diameter of between around 10 nm and 1000 nm are considered nanoparticles. In implementations of the invention, the loading of the filler material in the sacrificial material may range from around 5% to around 50%.

In implementations of the invention, the nanoparticles used should be soluble, or at least capable of being removed by, a chemical that may also be used to remove the sacrificial material. For instance, if a photoresist developer solution (e.g., a TMAH solution) is used to remove the sacrificial material, then the selected nanoparticles must also be capable of being removed by the developer solution. In further implementations, surface modifications to the nanoparticles may be used to render insoluble nanoparticles soluble in the chemical used to remove the sacrificial material. Generally, the chemical used to remove the sacrificial material will have a basic pH level, therefore, in most implementations of the invention, the filler material should be base-soluble or at least capable of being removed by a basic solution.

Although a wide variety of filler materials are available, some specific filler materials that may be used in implementations of the invention include, but are not limited to, base-soluble styrene-butadiene rubber (SBR) or nitrile-butadiene rubber (NBR) nanospheres, polystyrene-based nanoparticles, acrylic-based nanoparticles, or inorganic nanoparticles.

Figure 2:
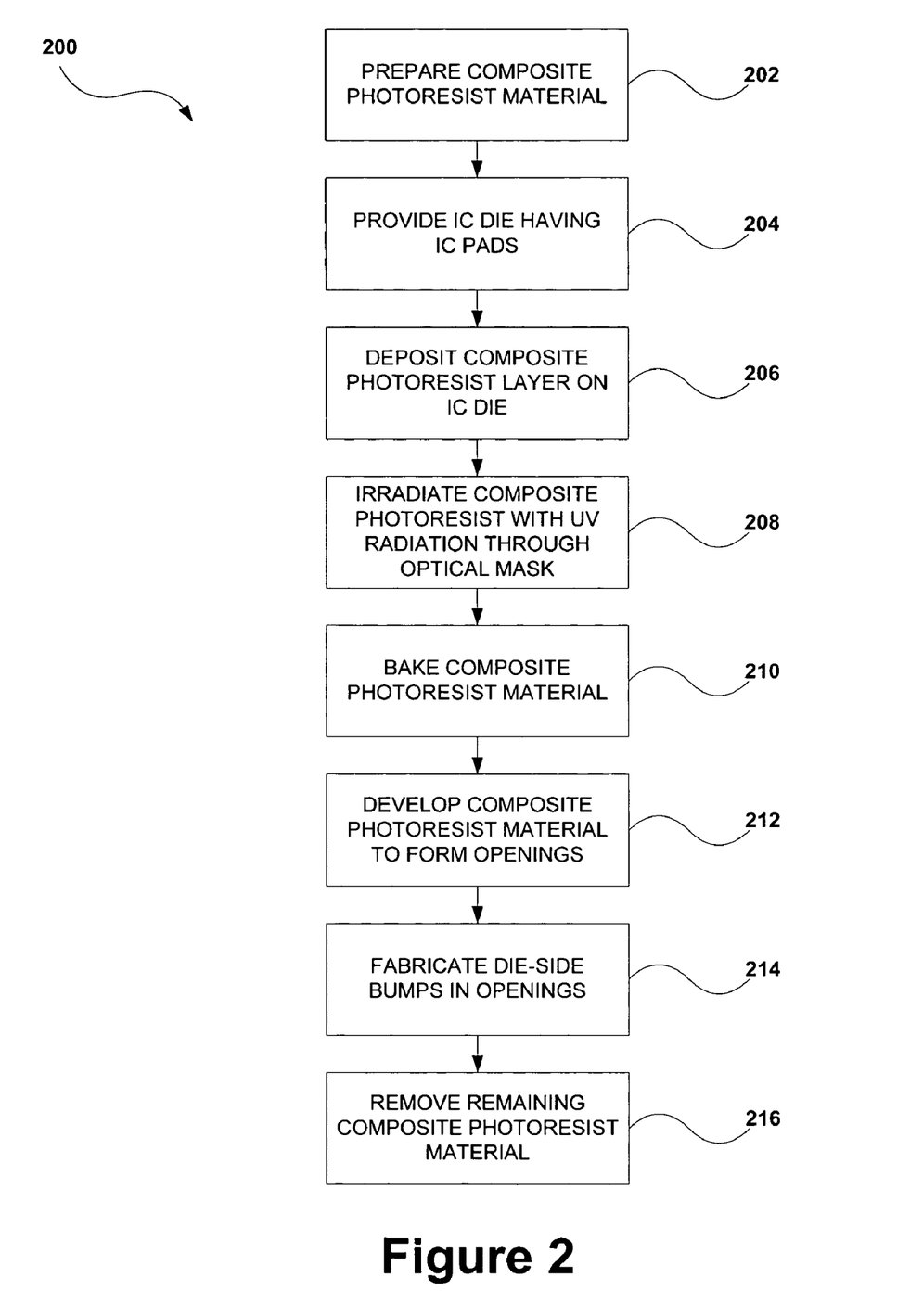
FIG. 2 is a method of forming a die-side bump in accordance with an implementation of the invention.

FIG. 2 is a method 200 of forming die-side bumps 130 with roughened sidewalls 132 and smooth top surfaces 134 in accordance with an implementation of the invention. FIGS. 3A to 3F illustrate the various process stages of the method 200.

The method 200 begins with the preparation of a composite sacrificial material (process 202 of FIG. 2). In implementations of the invention, the sacrificial material may be a photoresist, a SLAM, a BARC, or another acceptable sacrificial material. A filler material, such as a material that includes nanoparticles, is mixed with the sacrificial material to form the composite sacrificial material. In the method of FIG. 2, a photoresist material is used as the sacrificial material.

In some implementations, the filler material may be added to the sacrificial material using a batch process. The sacrificial material and the filler material may be combined as a batch and then mixed. In other implementations, the filler material may be added to the sacrificial material using an in-line mixing process. For example, the filler material and the sacrificial material may be combined and mixed in-line prior to being deposited on an IC die or a semiconductor wafer. As described above, the loading of the filler material in the sacrificial material may range from 5% to 50%.

In one specific implementation of the invention, an acrylic-based photoresist is used, such as the JSR THB-150N, with base-soluble SBR or NBR rubber nanospheres added to the photoresist material. In such an implementation, the size of the rubber nanospheres may range from 10 nm to 100 nm and the loading may range from 1% to 25%.

An IC die is provided that includes IC pads upon which the die-side bumps are to be formed (204). The IC pads are electrically conductive surfaces that couple underlying interconnect layers within the IC die to electrical elements outside of the IC die through the die-side bumps. The IC pads may be formed using a metal such as copper or aluminum and may be mounted within a passivation layer. Under-bump metallurgy (UBM) layers may also be formed on the IC die. The UBM layers generally consist of a barrier layer and a metal seed layer. The barrier layer may be formed from conventional barrier materials for UBM layers, such as titanium or tungsten. The metal seed layer may consist of copper metal, or it may consist of another metal such as iridium (Ir), platinum (Pt), palladium (Pd), rhodium (Rh), osmium (Os), gold (Au), silver (Ag), rhenium (Re), ruthenium (Ru), tungsten (W), nickel (Ni), or cobalt (Co). Deposition processes such as physical vapor deposition (PVD), sputtering, chemical vapor deposition (CVD), or atomic layer deposition (ALD) may be used to deposit the UBM layers.

Figure 3A:
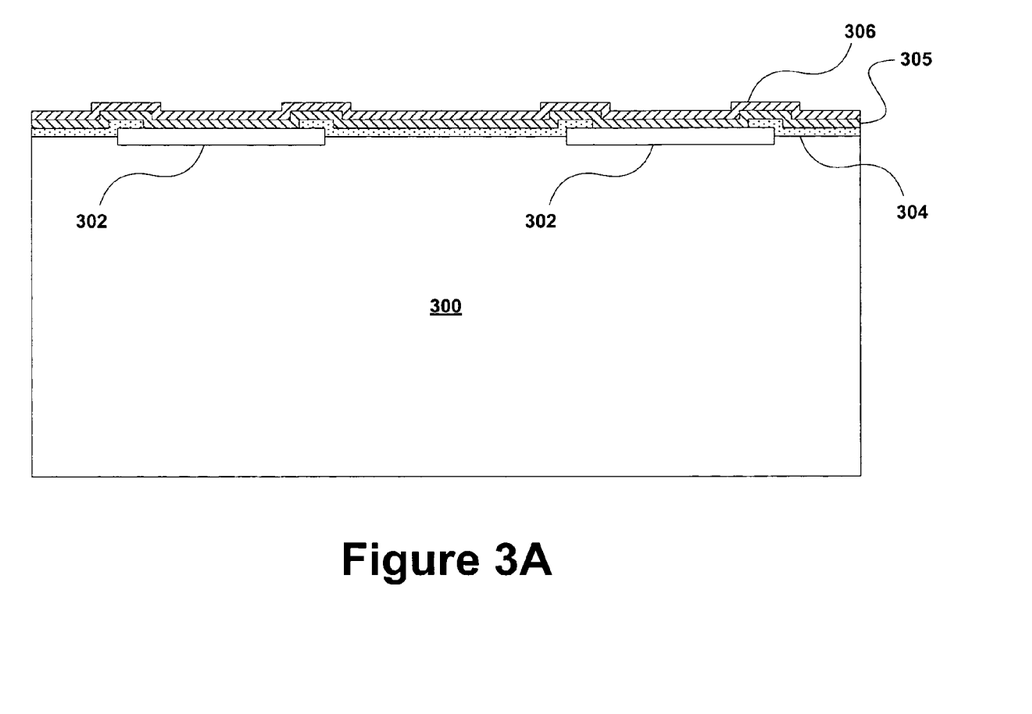
FIGS. 3A to 3F illustrate various process stages of the method described in FIG. 2.

FIG. 3A illustrates an IC die 300 that includes IC pads 302. A passivation layer 304 is formed around the IC pads 302. The passivation layer may be formed using materials such as nitrides, polyimides, oxides, or oxynitrides. A UBM layer consisting of a barrier layer 305 may be formed over the passivation layer 304 and the IC pads 302. A second UBM layer consisting of a metal seed layer 306 may be formed upon the barrier layer 305. The metal seed layer 306 is used to catalyze a subsequent electroplating process.

Figure 3B:
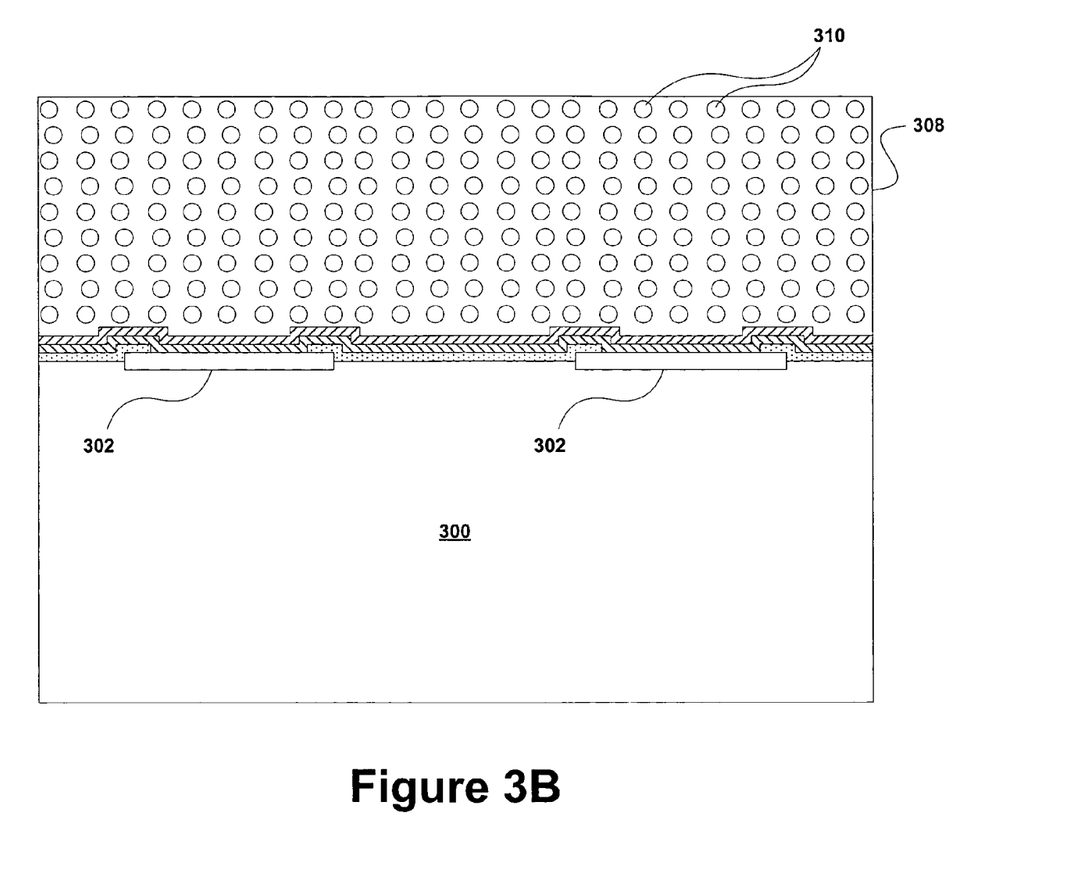

The composite photoresist material is then applied over the metal seed layer on the IC die (206). In implementations of the invention, the composite photoresist material may be applied using a spin-on deposition (SOD) process. This results in a composite photoresist layer being deposited on the IC die. FIG. 3B illustrates the IC die 300 with a composite photoresist layer 308 that has been deposited over the metal seed layer 306. The composite photoresist layer 308 includes a plurality of nanoparticles 310 that form the filler material.

Next, the composite photoresist layer may be patterned to form openings in which die-side bumps may be formed. As is well known in the art, the photoresist may be patterned using a lithography process that irradiates the photoresist layer with ultraviolet (UV) radiation through an optical mask (208). The optical mask contains a pattern for the bump openings and this pattern is transferred into the composite photoresist layer by way of the ultraviolet radiation.

Figure 3C:
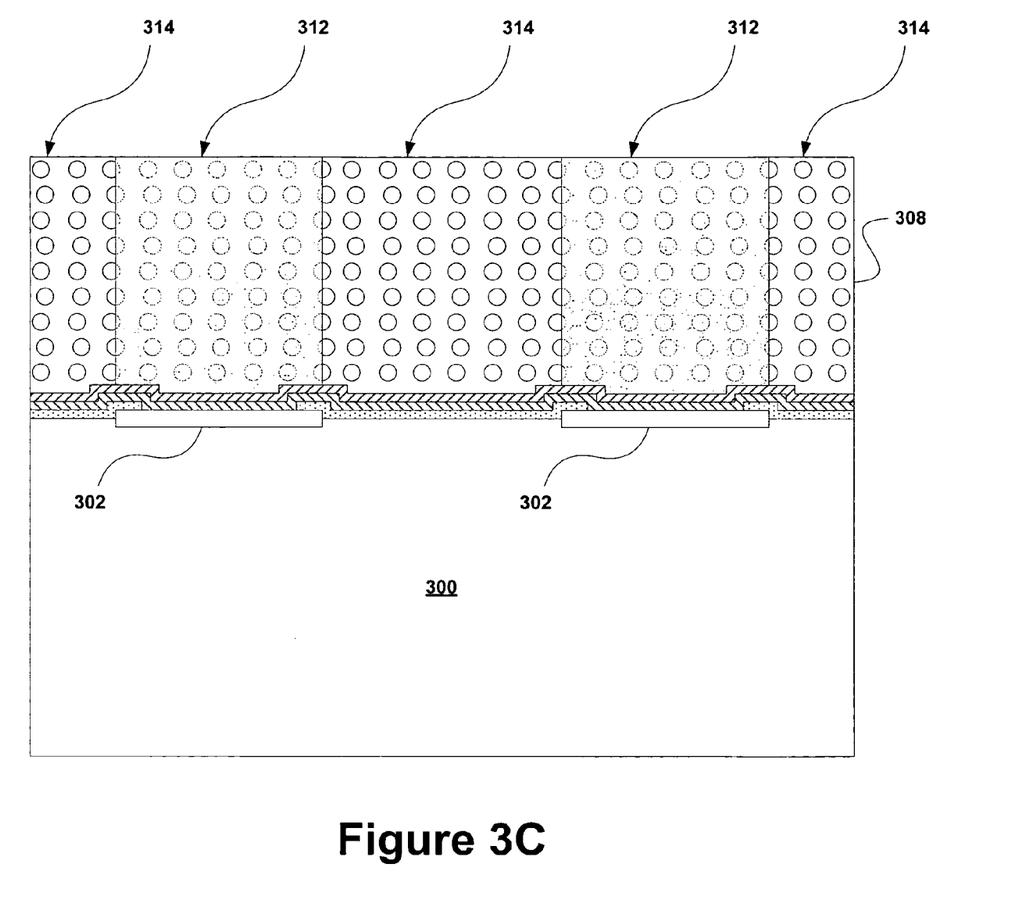

FIG. 3C illustrates the composite photoresist layer 308 after it has been exposed to the ultraviolet radiation. If a positive photoresist material is used in the composite photoresist layer 308, then portions 312 of the composite photoresist layer 308 have been exposed to the radiation while portions 314 have been masked from exposure. Alternately, if a negative photoresist is used in the composite photoresist layer 308, it is portions 314 that have been exposed to the radiation while portions 312 have been masked from exposure. In both instances, the portions 312 define openings in the photoresist layer 308 that will be used to form the die-side bumps.

In implementations of the invention, the lithography process may be optimized for the filler material used in the composite photoresist. For instance, for larger filler sizes, the lithography process may be optimized to reduce or prevent scattering of the ultraviolet radiation. In one implementation, if the filler material has an average diameter of between around 10 nm and around 100 nm, then ultraviolet radiation having a wavelength of 365 nm (i.e., i-line lithography), 436 nm (i.e., g-line lithography), or 405 nm (i.e., h-line lithography) may be used. In general, an appropriate diameter for the filler material would be a diameter that is smaller than the wavelength of the radiation used, and more specifically, a diameter that is less than one-fourth of the size of the wavelength used.

The composite photoresist layer may then be baked (often referred to as post-exposure bake), thereby assisting any reactions occurring in the photoresist areas that were exposed to radiation (210). The baking process facilitates the chemical conversion of the exposed areas so that exposed and unexposed areas will have different solubility in developer and thus allow the pattern to be developed. For example, in a positive photoresist, baking will facilitate the chemical reaction in portions 312 that converts the resist from insoluble in developer to soluble in developer. Likewise, in a negative photoresist, baking will facilitate the chemical transformation in portions 314 that converts the resist from soluble in developer to insoluble in developer.

A developer solution is then applied that removes soluble portions of the composite photoresist layer, leaving behind openings in the composite photoresist layer (212). As described above, the developer solution can be a basic solution that is capable of removing the photoresist material and filler material (in the exposed areas of a positive photoresist or the unexposed areas of a negative photoresist), such as TMAH, potassium hydroxide (KOH), tetrabutyl ammonium hydroxide (TBAH), or a similar basic solution. As such, the developer solution removes the photoresist material as well as the filler material within the area to be opened. Alternatively, organic photoresist developers (such as cyclohexanone, cyclopentanone, or isopropanol) can be used as is commonly known by those skilled in the art.

Figure 3D:
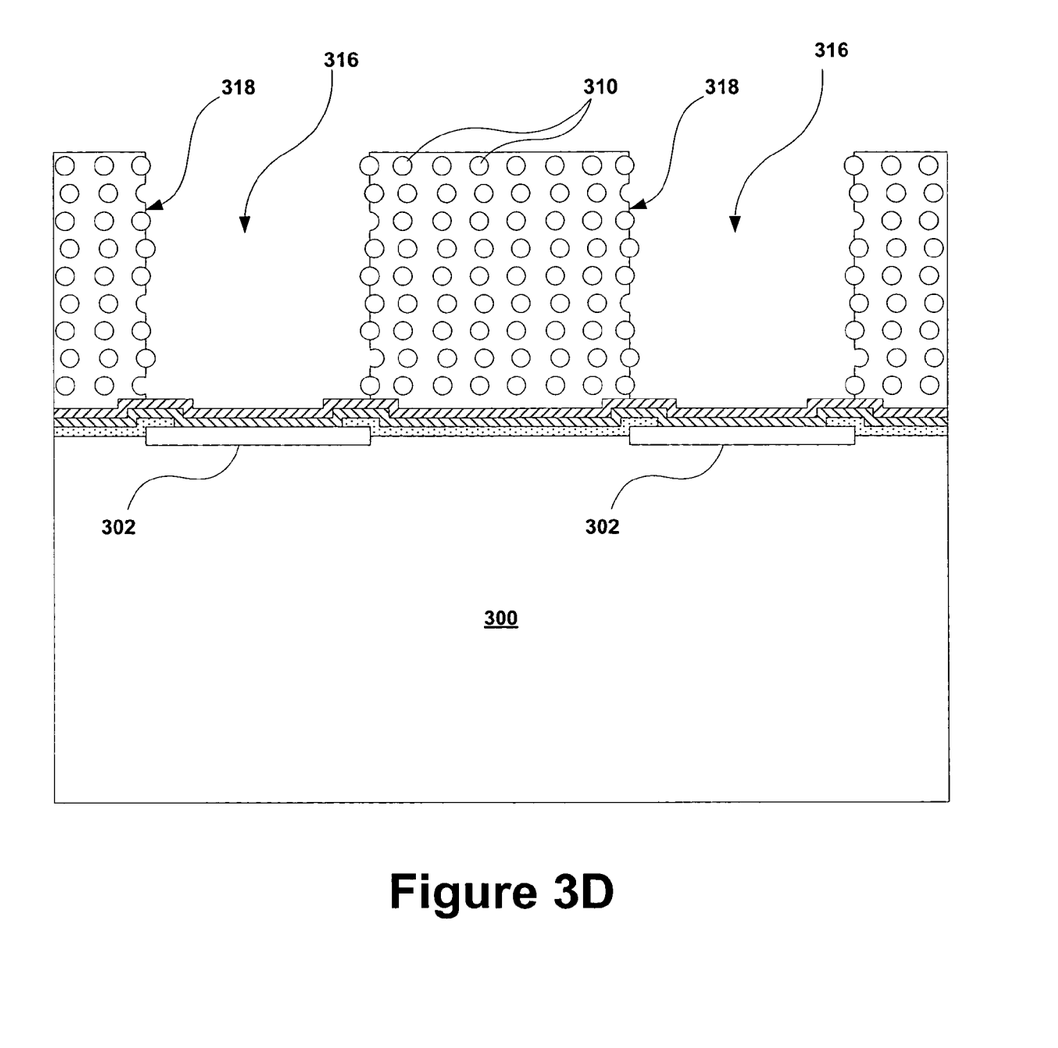

FIG. 3D illustrates openings 316 that are formed when the developer-soluble portions 312 of the composite photoresist layer 308 are removed. As shown in FIG. 3D, when the developer-soluble composite photoresist material 312 is removed, the filler material 310 imparts a roughed surface to the sidewalls 318 of the openings 316. The roughened sidewalls 318 include depressed areas and elevated areas. These roughed areas are generally formed due to impressions left in the composite photoresist layer 308 by the nanoparticles 310, as well as embedded nanoparticles 310 that still remain.

The openings may be cleaned to remove any remaining unwanted material. Next, die-side bumps may be fabricated within the openings in the composite photoresist layer using an electroplating process (214). As known to those of skill in the art, in such an electroplating process, metal layers are deposited within the openings in the composite photoresist layer by putting a negative bias on the IC die and immersing it into a plating bath that contains a salt of the metal to be deposited. The metallic ions of the salt carry a positive charge and are attracted to the metal seed layer on the IC die. When the ions reach the metal seed layer, the negatively charged IC die provides the electrons to "reduce" the positively charged ions to metallic form, thereby causing the metal to become deposited on the metal seed layer. The metal seed layer provides an area of attachment for the metal ions. The use of an electroplating process therefore fills the openings in the composite photoresist layer with a metal that conforms to the roughened sidewalls of the openings while maintaining a smooth top surface.

Copper metal is generally the metal used to fill the openings and form the die-side bumps. In alternate implementations, other metals including, but not limited to, aluminum, tungsten, gold, nickel, cobalt, platinum, palladium, osmium, iridium, ruthenium, rhodium, silver, copper alloys, and lead/tin alloys may be used as well.

Figure 3E:
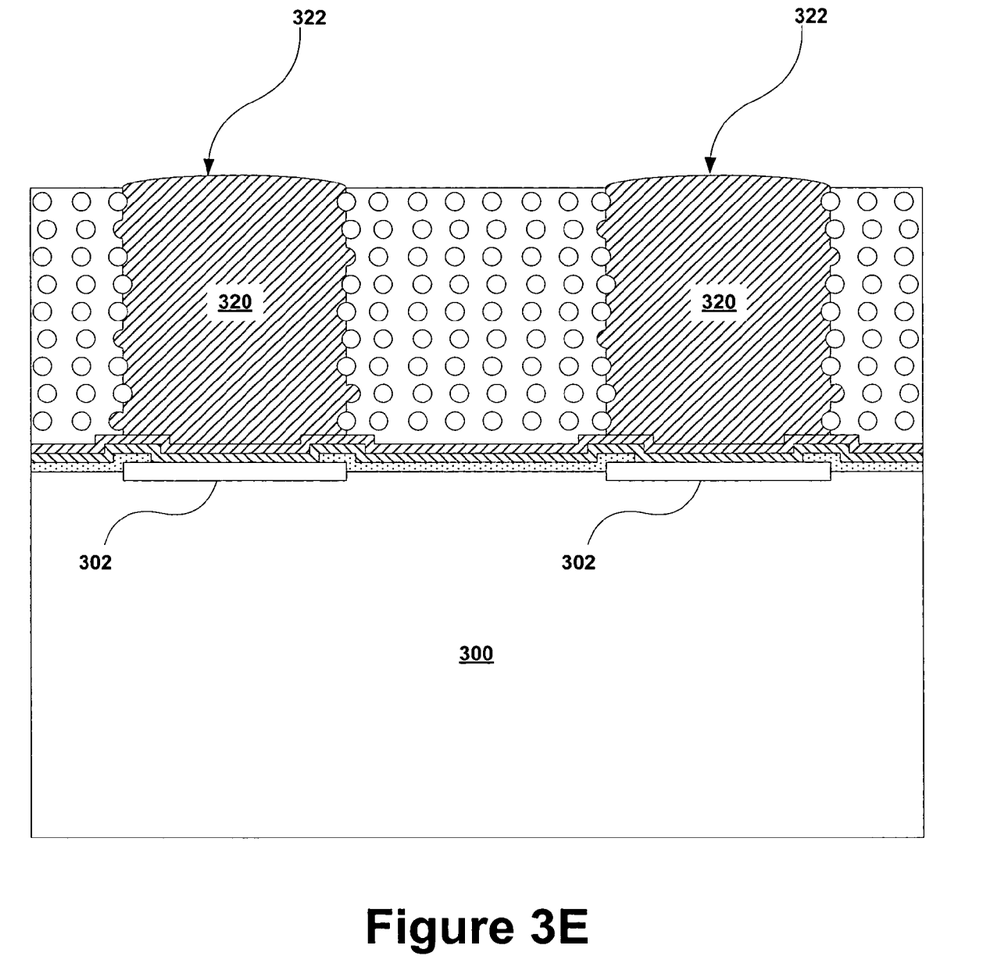

FIG. 3E illustrates copper die-side bumps 320 that have been formed by using an electroplating process to fill the openings 316 with copper metal. As shown, the copper die-side bumps 320 have sidewalls that conform to the roughened sidewalls 318 of the openings 316 while maintaining a smooth top surface 322.

Once the openings are filled with metal to form the copper die-side bumps, the remaining composite photoresist is removed (216). Conventional processes known for removing remaining photoresist material may be used. One such process uses a solvent or solvent mixture, as is known in the art. Such a process removes both the developer-insoluble photoresist material as well as the remaining filler material. The end result is one or more copper die-side bumps that have roughened sidewalls but smooth top surfaces.

In addition, unnecessary portions of the metal seed layer and underlying barrier layer may also be etched away at this stage in the process. Conventional processes for removing the seed and barrier layers may be used, for instance, using conventional wet or dry etch processes that are well known in the art.

Figure 3F:
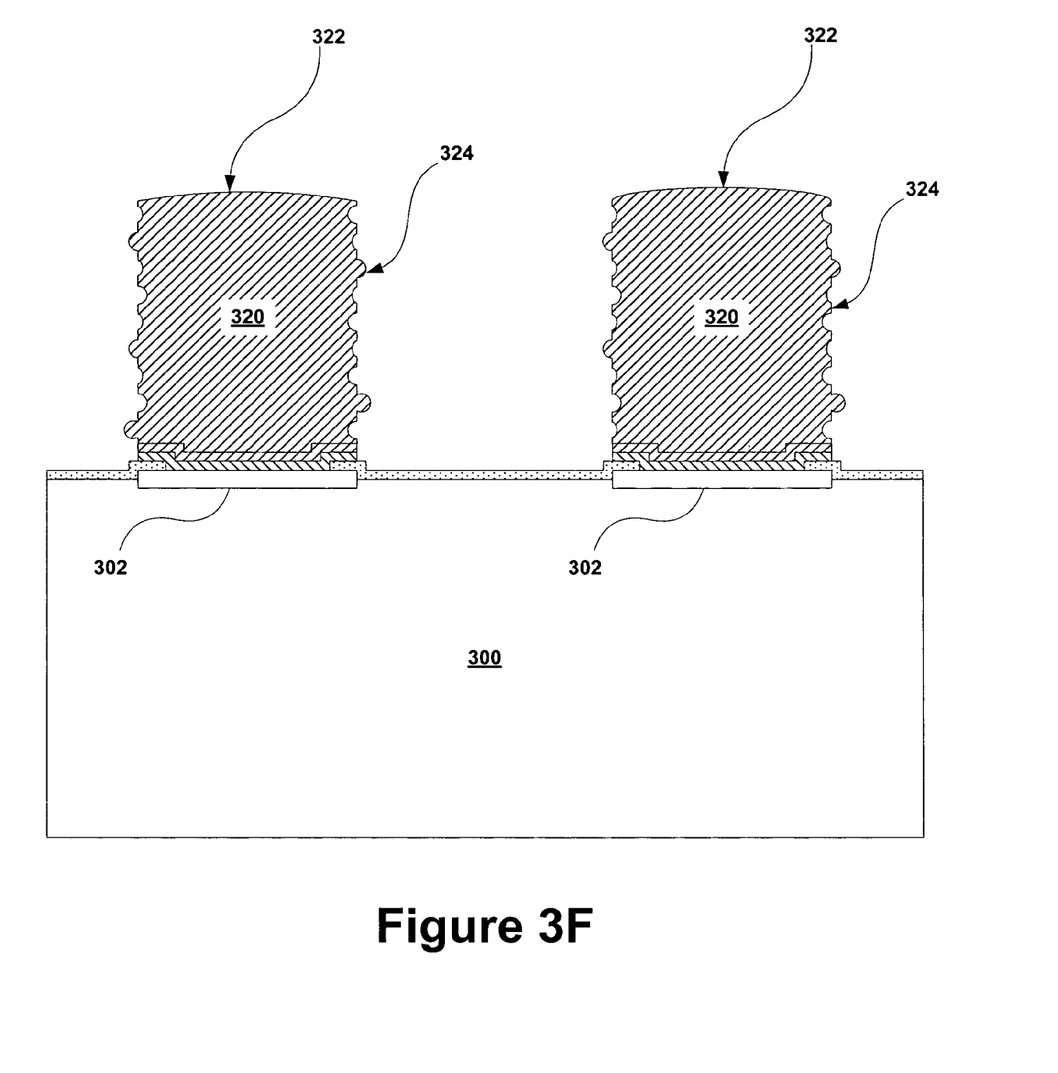

FIG. 3F illustrates the copper die-side bumps 320 after the composite photoresist layer 308 has been removed and exposed portions of the seed and underlying barrier layers have been etched away. The end result is the IC die 300 with one or more die-side bumps 320 formed thereon. Generally, the end result is the IC die 300 with an array of die-side bumps 320. And unlike the prior art, the die-side bumps 320 that are formed in accordance with implementations of the invention have roughened sidewalls 324 but do not have roughened top surfaces 322. Furthermore, the underlying IC die 300 has not suffered damage by avoiding the use of a microetchant.

The completed die-side bumps 320 may now be sent through a conventional "flip-chip" packaging process where the roughened surface of the sidewalls 324 will improve adhesion to an epoxy underfill material. As described above, the roughened sidewalls 324 improve adhesion because the imperfections in the sidewalls 324 (e.g., elevated and depressed areas on the die-side bump sidewalls) mechanically secure the epoxy underfill material to the sidewall, substantially locking the epoxy material in place and thereby leading to better reliability performance.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   preparing a composite sacrificial material;
   providing an IC die that includes at least one IC pad;
   depositing the composite sacrificial material on the IC die;
   patterning the composite sacrificial material to form an opening over the IC pad, wherein the composite sacrificial material produces an opening having a sidewall with a roughened surface;
   depositing a metal layer into the opening to form a metal bump, wherein the roughened surface of the opening sidewall imparts a roughened surface to a sidewall of the metal bump; and
   removing the remaining composite sacrificial material.

2. The method of claim 1, wherein the preparing of the composite sacrificial material comprises mixing a photoresist material with a filler material that includes nanoparticles.

3. The method of claim 2, wherein the photoresist material comprises at least one of an acrylic-based photoresist, a novolak-based photoresist, a polyhydroxystyrene-based photoresist, a SLAM, or a BARC.

4. The method of claim 2, wherein the nanoparticles comprise at least one of base-soluble styrene-butadiene rubber nanospheres, nitrile-butadiene rubber nanospheres, polystyrene-based nanoparticles, acrylic-based nanoparticles, or inorganic nanoparticles.

5. The method of claim 1, wherein the depositing of the composite sacrificial material comprises using a spin-on deposition process to deposit the composite sacrificial material.

6. The method of claim 1, wherein the patterning of the composite sacrificial material comprises:
   irradiating the composite sacrificial material with ultraviolet radiation through an optical mask, wherein a pattern for the opening is defined in the optical mask and transferred to the composite sacrificial material by way of the ultraviolet radiation;
   baking the composite sacrificial material; and
   developing the composite sacrificial material to remove developer-soluble portions of the composite sacrificial material and form the opening.

7. The method of claim 6, wherein the ultraviolet radiation exposure comprises the use of i-line lithography.

8. The method of claim 1, wherein the depositing of the metal layer comprises electroplating a copper metal layer into the opening.

9. The method of claim 1, wherein the removing of the remaining composite sacrificial material comprises applying a developer solution.

10. The method of claim 9, wherein the developer solution comprises TMAH.

* * * * *

UNITED STATES PATENT AND TRADEMARK OFFICE
CERTIFICATE OF CORRECTION

| | | |
|---|---|---|
| PATENT NO. | : 7,585,615 B2 | Page 1 of 1 |
| APPLICATION NO. | : 11/495368 | |
| DATED | : September 8, 2009 | |
| INVENTOR(S) | : Schultz et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 299 days.

Signed and Sealed this

Fourteenth Day of September, 2010

David J. Kappos
*Director of the United States Patent and Trademark Office*